(12) United States Patent
Koors et al.

(10) Patent No.: US 6,262,489 B1
(45) Date of Patent: Jul. 17, 2001

(54) FLIP CHIP WITH BACKSIDE ELECTRICAL CONTACT AND ASSEMBLY AND METHOD THEREFOR

(75) Inventors: Mark Anthony Koors, Kokomo; Robert Vajagich, Carmel; Charles I Delheimer, Noblesville; Scott David Brandenburg, Kokomo; Gary Eugene Oberlin, Windfall, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/434,552

(22) Filed: Nov. 8, 1999

(51) Int. Cl.[7] .............................. H01L 23/48; H01L 23/52; H01L 29/40
(52) U.S. Cl. .......................... 257/784; 257/778; 438/108
(58) Field of Search ................................. 257/784, 787, 257/706, 707, 776, 778; 438/108, 612, 632

(56) References Cited

U.S. PATENT DOCUMENTS

| | | | |
|---|---|---|---|
| 3,972,062 | * | 7/1976 | Hopp . |
| 5,371,404 | * | 12/1994 | Juskey et al. . |
| 5,619,070 | * | 4/1997 | Kozono . |
| 5,650,918 | * | 7/1997 | Suzuki . |
| 6,124,636 | * | 9/2000 | Kusamitsu . |
| 6,144,101 | * | 11/2000 | Akram . |

* cited by examiner

*Primary Examiner*—Sheila V. Clark
(74) *Attorney, Agent, or Firm*—Jimmy L. Funke

(57) ABSTRACT

A method and assembly for mounting an IC semiconductor device to a substrate using flip chip technology. The assembly generally entails a flip chip having a first surface, an oppositely-disposed second surface, an integrated circuit that includes a vertical device on the first surface, and an electrical contact for the vertical device on the second surface. The flip chip is bonded with first solder connections to a first conductor pattern on a substrate, so that the first solder connections electrically and mechanically connect the flip chip to the substrate. The assembly further includes an electrical contact member that is positioned so that the flip chip is between the contact member and the substrate. The contact member is electrically and mechanically connected to a second conductor pattern on the substrate with second solder connections. A third solder connection electrically and mechanically connects the contact member to the electrical contact on the second surface of the flip chip.

19 Claims, 1 Drawing Sheet

FLIP CHIP WITH BACKSIDE ELECTRICAL CONTACT AND ASSEMBLY AND METHOD THEREFOR

TECHNICAL FIELD

The present invention generally relates to semiconductor integrated circuit (IC) devices. More particularly, this invention relates to a method and structure for providing a backside electrical contact to an IC device chip in which a vertical IC device is formed.

BACKGROUND OF THE INVENTION

As well known in the electronics industry, a flip chip is an unpackaged integrated circuit (IC) chip having bond pads on which solder bumps are formed, with its active side (the surface of the chip containing the active circuit devices and bonding pads) oriented face down toward the circuit substrate, such as a printed circuit board (PCB), to which the flip chip is attached with the solder bumps. Attachment is by registering and reflow soldering the solder bumps to a conductor pattern on a substrate. An advantage of flip chips is that they allow the direct attachment of semiconductor integrated circuits to circuit boards, eliminating the need for an interfacing package.

The usage of flip chips is increasing in the electronics industry. For some applications, vertical devices such as field effect transistors (FET) are required. As known in the art, vertical IC devices are characterized by current flow through the thickness of the device chip. In the past, chips with vertical circuit devices have required wire bonding or specialized packaging. One packaging approach is to solder the device chip to a copper slug having input/output (I/O) pads wirebonded to a leadframe on a substrate. In addition to making electrical connections, the copper slug serves as a heatsink for the device. While suitably performing the intended purpose, significant additional process and material costs are incurred with such packaging practices. Accordingly, it would be desirable if a method were available by which vertical IC devices could be mounted to a substrate without conventional packaging. It would be particularly desirable if such a method could benefit from the assembly and processing advantages available with flip chip technologies.

SUMMARY OF THE INVENTION

The present invention is directed to a method and assembly for mounting a vertical IC semiconductor device to a substrate using flip chip technology. In addition to providing electrical contacts to opposite sides of the device, the assembly also provides a heat dissipation function.

The assembly of this invention generally entails a flip chip having a first surface, an oppositely-disposed second surface, an integrated circuit on the first surface, and an electrical contact on the second surface. According to a preferred aspect of this invention, the integrated circuit may include a vertical device such as an FET, so that current flows through the flip chip between its first and second surfaces. The flip chip is bonded with first solder connections to a first conductor pattern on a suitable substrate, so that the first solder connections electrically and mechanically connect the flip chip to the substrate. The assembly further includes an electrical contact member that is positioned so that the flip chip is between the electrical contact member and the substrate. The electrical contact member is electrically and mechanically connected to a second conductor pattern on the substrate with second solder connections. Finally, a third connection electrically and mechanically connects the electrical contact member to the electrical contact on the second surface of the flip chip.

In a preferred embodiment, the electrical contact member is formed to include a first portion joined to the flip chip and a second portion joined to the substrate, with the first portion having a lower coefficient of thermal expansion (CTE) than the second portion. According to this aspect of the invention, the use of a lower CTE material in the vicinity of the flip chip serves to reduce stress levels that would otherwise significantly reduce the fatigue life of the assembly, and particularly the joint between the contact member and the flip chip.

From the above, one can see that the assembly of this invention is able to provide an uncomplicated method for mounting and attaching a vertical IC device and a backside electrical contact to a substrate using flip chip technology. As with conventional flip chip methods, the flip chip is mounted to the substrate with its electrical contact facing away from the substrate, its integrated circuit facing the substrate, and its solder bumps registered with the first conductor pattern on the substrate. The electrical contact member is then positioned on the substrate so that the flip chip is between the electrical contact member and the substrate. Thereafter, both the flip chip and the contact member are reflow soldered to the substrate, forming the first and second solder connections. In addition, the contact member is joined, preferably reflow soldered, to the flip chip, forming the third connection that electrically and mechanically connects the contact member to the electrical contact on the flip chip.

In addition to making a reliable and fatigue-resistant electrical contact with the flip chip, a benefit of the third connection is that it can be used to draw the flip chip toward the contact member during reflow soldering. In this manner, the contact member prevents the first solder connections of the flip chip from collapsing during reflow soldering, as can occur if the surface tension of the molten solder draws the flip chip excessively close to the substrate during reflow. Sufficient spacing between a flip chip and its substrate, known as the "stand-off height," is desirable for enabling stress relief during thermal cycles, allowing penetration of cleaning solutions for removing undesirable processing residues, and enabling the penetration of mechanical bonding and underfill materials between the chip and its substrate. As such, the assembly method of this invention promotes the life of the flip chip assembly by helping to control the final height of the first solder connections.

Other objects and advantages of this invention will be better appreciated from the following detailed description.

DESCRIPTION OF THE PREFERRED EMBODIMENT

Figure 1:
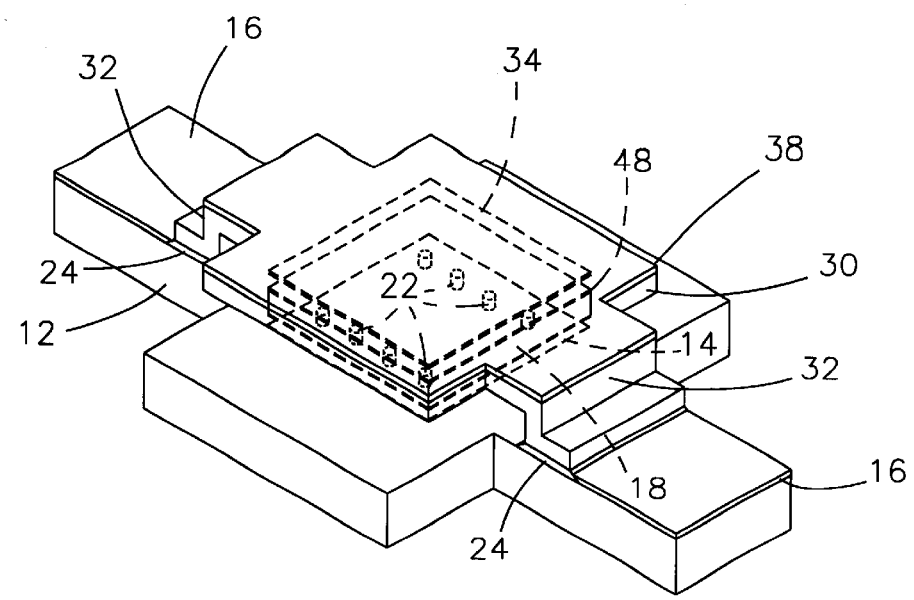
FIG. 1 is a perspective view if a flip chip assembly in accordance with a preferred embodiment of this invention.

FIG. 1 represents a flip chip assembly 10 in accordance with a preferred embodiment of this invention. The assembly 10 is shown as being flip-chip mounted to a substrate 12, which may be a printed circuit board (PCB), flexible circuit, or a silicon, ceramic or insulated metal substrate, as is known in the art. The assembly 10 includes a semiconductor flip chip 18 and a contact member 20, both of which are reflow soldered to conductors 14 and 16, respectively, on the substrate 12. As is generally conventional, the flip chip 18 includes an integrated circuit 28 (FIGS. 2 and 3) on its lower surface facing the substrate 12, and solder connections 22 (FIG. 3) that electrically and mechanically secure the flip chip 18 to the conductors 14 on the substrate 12. According to a preferred aspect of the invention, the integrated circuit 28 includes a vertical IC device, such as an FET. such that current flows through the thickness of the chip 18. The contact member 20 of this invention serves to make electrical contact with a contact 48 (FIG. 2) on the surface of the chip 18 opposite the solder connections 22 and circuit 28. Solder connections 24 between the contact member 20 and the conductors 16 electrically connect the contact 48 with circuitry (not shown) on the substrate 12.

Figure 2:
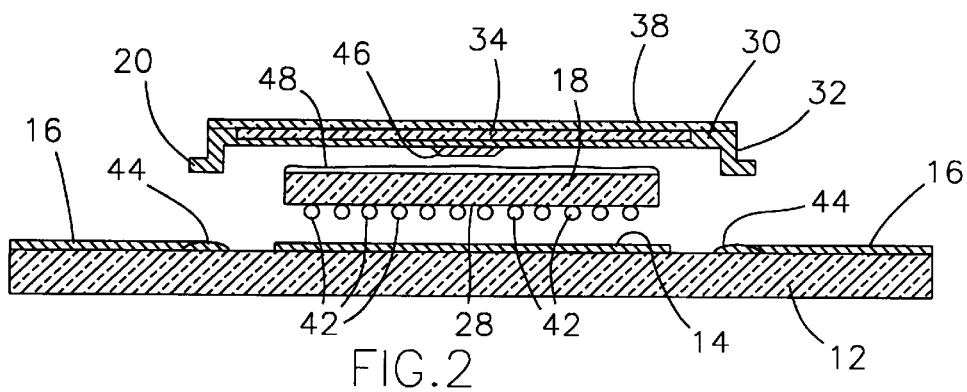
FIG. 2 is an exploded cross-sectional side view of the components of the flip chip assembly of FIG. 1 prior to assembly.
Figure 3:
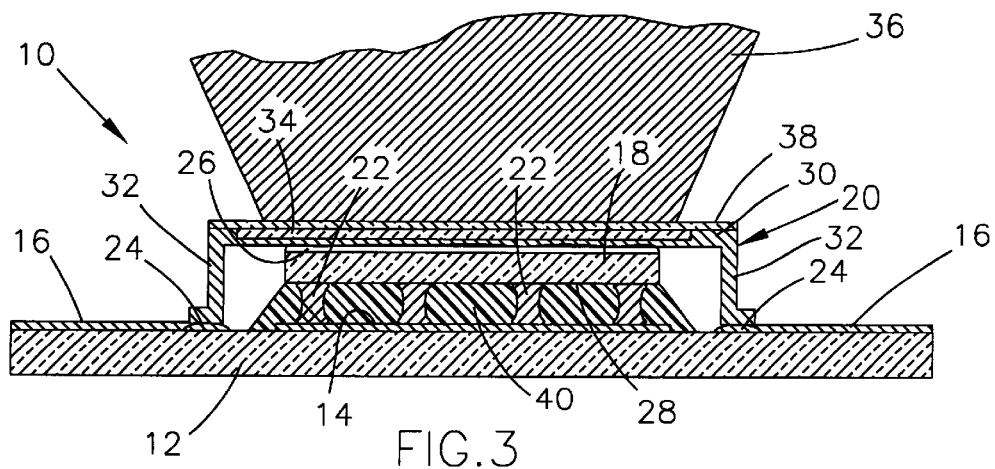
FIG. 3 is a cross-sectional side view of the flip chip assembly of FIG. 1.

As depicted in the Figures, the contact member 20 is formed to have a generally planar portion 30 and a pair of legs 32 disposed at opposite ends of the planar portion 30. The legs 32 project downwardly from the planar portion 30 to the substrate 12, defining a cavity in which the flip chip 18 is received. Copper or one of its alloys may be used as the material for the contact member 20 to promote its electrical and thermal conductivity. The coefficient of thermal expansion (CTE) of copper is about 17 ppm/° C., which is relatively compatible with typical materials used for the substrate 12. However, the CTE of the flip chip 18 is considerably lower—about 4 ppm/° C. for a silicon chip. Preliminary testing indicated that a solder joint between a flip chip and a contact member 20 formed only of copper was susceptible to fatigue fracturing during thermal cycling. Accordingly, a preferred aspect of this invention is to reduce the CTE of the planar portion 30 of the contact member 20, i.e., that portion of the contact member 20 attached to the chip 18. As shown in FIGS. 2 and 3, a preferred approach is to use copper as the base material for the contact member 20, but to modify the planar portion 30 to contain at least one layer 34 of a material whose CTE is much lower than copper, so that the effective CTE of the planar portion 30 is closer to that of the chip 18 while the remainder of the contact member 20 has a CTE relatively close to that of the substrate 12. Suitable low-CTE materials for this purpose include molybdenum, INVAR® (iron-nickel alloys containing 34% to 37% nickel) and tungsten. With the balance of the contact member 20 formed of copper or a copper alloy, suitable results may be achieved if the low-CTE layer 34 constitutes more than half of the total thickness of the planar portion 30. For low power devices where thermal conductivity is not critical forming the planar region 30 to have about 80% of its thickness as an inlay of INVAR is suitable. As an example, if an INVAR layer constitutes about 80% of the thickness of the planar region 30, the effective CTF of the planar region 30 is about 3.4 ppm/° C. For high power devices that benefit from supplemental thermal management, a molybdenum inlay that constitutes about 74% of the thickness of the planar region 30 has provided very good thermal conductivity (about 208 W/mK) and reduced the effective CTE of the planar region 30 to about 5.7 ppm/° C. Similarly, a tungsten inlay that constitutes about 60% of the thickness of the planar region 30 provides very good thermal conductivity (about 240 W/mK) and reduces the effective CTE of the planar region 30 to about 7 ppm/° C. In a preferred embodiment, a layer of copper overlies a molybdenum inlay layer 34 to create a three-layer planar region 30 of 13% copper, 74% molybdenum and 13% copper, based on total thickness of the planar region 30.

FIG. 2 represents the assembly 10 prior to being registered and reflow soldered to the substrate 12. In FIG. 2, the flip chip 18 is shown as having multiple solder bumps 42 on its lower surface. As is conventional for electronic applications, the solder bumps 42 may be formed of a tin-based, lead-based or indium-based solder alloy that can be reflowed at sufficiently low temperatures to avoid thermal damage to the chip 18. When the chip 18 is properly mounted to the substrate 12, the solder bumps 12 are registered with respective conductors 14. During reflow, the solder bumps 42 flow and coalesce to yield the columnar solder connections 22 shown in FIG. 3. Solder 44 and 46 is also shown as being deposited on the conductors 16 and the lower surface of the planar portion 30 of the contact member 20, by which solder connections 24 and 26, respectively, are formed between the legs 32 and conductors 16, and between the contact member 20 and the flip chip 18. While solder is preferred to make the electrical and mechanical connection between the flip chip 18 and contact member 20, it is foreseeable that an electrically-conductive adhesive could be used to form the connection 26.

Also shown in FIG. 2 is an optional layer of electrical insulation 38, which reduces the likelihood of shorting between the contact member 20 and any surrounding structures. Suitable materials for the insulation 38 include diamond-like carbon (DLC), and thermally conductive thermoplastic materials such as Paralyne. One particular example for use of the insulation 38 is shown in FIG. 3, in which a heatsink 36 is shown as contacting the contact member 20 in order to assist in dissipating heat from the flip chip 18. FIG. 3 also shows the chip 18 as being underfilled with a suitable underfill material 40, as is well known in the art for promoting the thermal cycle life of the solder connections 22. Notably, by positioning the legs 32 of the contact member 20 along opposite edges of the planar portion 30, the present invention does not impede underfilling of the chip 18 by conventional underfill methods. The contact member 20 particularly does not interfere with underfilling the corners of the chip 18, for which uniform underfilling can be more critical due to there often being higher stresses at the corners during thermal cycling.

From the structure described above, it can be seen that the flip chip 18 and contact member 20 are both adapted for mounting and attachment to the substrate 12 by flip-chip techniques. After conventional processing of the flip chip 18 to produce the integrated circuit 28 and solder bumps 42, the chip 18 is registered with its conductors 14 on the substrate 12. Prior to reflowing the solder bumps 42 on the chip 18, the contact member 20 is also preferably mounted to the substrate 12, with its legs 32 registered with the conductors 16 and its lower surface contacting the upper surface of the chip 18. In this manner, the solder bumps 42 and the solder 44 and 46 can be reflowed to form the solder connections 18, 24 and 26, respectively. A feature of this invention is the ability of the contact member 20 to prevent the flip chip 18 from being drawn excessively close to the substrate 12 by the molten solder bumps 42 during reflow. For this purpose, the solder 46 used to adhere the chip 18 to the contact member 20 preferably has a higher melting or liquidus temperature than the solder compositions for the solder bumps 42 and the solder 44. In this manner, the solder bumps 42 and solder 44 melt first during reflow, which insures proper signal connections between the integrated circuit 28 and its corresponding conductors 14 by allowing the solder connections 22 to be formed prior to the contact solder connection 26. Further heating then causes the solder 46 between the chip 18 and contact member 20 to reflow, completely wetting the opposing surfaces to promote electrical and thermal contact between the contact member 20 and the contact 48 on the chip 18. The surface tension of the molten solder 46 counteracts the surface tension of the molten solder bumps 42, which would otherwise draw the flip chip 18 toward the substrate 12 during reflow, as discussed above. As a result, the contact member 20 achieves sufficient spacing between the chip 18 and substrate 12, which allows penetration of cleaning solutions for removing undesirable processing residues after reflow, enables the underfill material 40 to completely penetrate and fill the gap between the chip 18 and substrate 12, and promotes stress relief during thermal cycling.

While the invention has been described in terms of a preferred embodiment, it is apparent that other forms could be adopted by one skilled in the art. For example, the contact member 20 could be configured differently from that shown in the Figures and yet achieve the objects of this invention, and different materials could be used than those noted. Accordingly, the scope of the invention is to be limited only by the following claims.

What is claimed is:

1. A flip chip assembly on a substrate having first and second conductor patterns, the flip chip assembly comprising:
    a flip chip mounted to the substrate, the flip chip having a first surface, an oppositely-disposed second surface, an integrated circuit on the first surface, and an electrical contact on the second surface;
    first solder connections electrically and mechanically connecting the flip chip to the first conductor pattern on the substrate;
    an electrical contact member positioned so that the flip chip is between the electrical contact member and the substrate, the electrical contact member comprising a first portion connected to the flip chip and a second portion connected to the substrate, the first portion having a lower coefficient of thermal expansion than the second portion;
    second solder connections electrically and mechanically connecting the second portion of the electrical contact member to the second conductor pattern on the substrate; and
    an electrically-conductive connection electrically and mechanically connecting the first portion of the electrical contact member to the electrical contact on the second surface of the flip chip.

2. The flip chip assembly according to claim 1, wherein the first portion is planar and substantially parallel to the second surface of the flip chip, and wherein the second portion is defined by at least two legs that extend from the first portion to the substrate.

3. The flip chip assembly according to claim 1, wherein the first portion comprises at least two layers of different materials, a first of the different materials having a lower coefficient of thermal expansion than a second of the different materials.

4. The flip chip assembly according to claim 1, wherein the first different material is chosen from the group consisting of molybdenum, tungsten and iron-nickel alloys containing 34% to 37% nickel, and the second different material is copper or an alloy thereof.

5. The flip chip assembly according to claim 1, wherein the electrically-conductive connection is a third solder connection, and wherein the first and second solder connections have lower reflow temperatures than the third solder connection.

6. The flip chip assembly according to claim 1, further comprising a heatsink contacting the electrical contact member on a side thereof opposite the flip chip.

7. The flip chip assembly according to claim 6, further comprising an electrical insulation layer between the heatsink and the electrical contact member.

8. A flip chip assembly on a substrate having first and second conductor patterns, the flip chip assembly comprising:
    a flip chip mounted to the substrate, the flip chip having a first surface, an oppositely-disposed second surface, an integrated circuit comprising a vertical device on the first surface, and an electrical contact for the vertical device on the second surface, so that current flows through the flip chip between the first and second surfaces thereof;
    first solder connections between the flip chip and the first conductor pattern on the substrate, the first solder connections electrically and mechanically connecting the flip chip to the substrate;
    an electrical contact member positioned so that the flip chip is between the electrical contact member and the substrate, the electrical contact member comprising a planar portion and at least two legs, the planar portion being substantially parallel to the second surface of the flip chip, the at least two legs being disposed on opposite edges of the planar portion and extending from the planar portion to the substrate, the planar portion having a lower coefficient of thermal expansion than the at least two legs;
    second solder connections electrically and mechanically connecting the at least two legs of the electrical contact member to the second conductor pattern on the substrate; and
    a third solder connection electrically and mechanically connecting the planar portion of the electrical contact member to the electrical contact on the second surface of the flip chip.

9. The flip chip assembly according to claim 8, wherein the planar portion comprises at least two layers of different materials, a first of the different materials having a lower coefficient of thermal expansion than a second of the different materials.

10. The flip chip assembly according to claim 9, wherein the second different material is between the first different material and the flip chip.

11. The flip chip assembly according to claim 9, wherein the first different material is chosen from the group consisting of molybdenum, tungsten and iron-nickel alloys containing 34% to 37% nickel, and the second different material is copper or an alloy thereof.

12. The flip chip assembly according to claim 8, wherein the first and second solder connections have lower reflow temperatures than the third solder connection.

13. The flip chip assembly according to claim 8, further comprising:
    a heatsink contacting the electrical contact member on a side thereof opposite the flip chip; and
    an electrical insulation layer between the heatsink and the electrical contact member.

14. A method of attaching a flip chip to a substrate having first and second conductor patterns, the method comprising the steps of:

positioning a flip chip on the substrate, the flip chip having a first surface, an oppositely-disposed second surface, an integrated circuit and a first bonding material on the first surface, and an electrical contact on the second surface, the first bonding material being registered with the first conductor pattern on the substrate;

positioning an electrical contact member on the substrate so that the flip chip is between the electrical contact member and the substrate, a second bonding material is between the electrical contact member and the substrate, and a third bonding material is between the flip chip and the electrical contact member; and then bonding the flip chip and the electrical contact member to the substrate and bonding the electrical contact member to the flip chip by first flowing the first and second bonding materials to form first connections that electrically and mechanically connect the flip chip to the substrate and to form second connections that electrically and mechanically connect the electrical contact member to the second conductor pattern on the substrate, and then flowing the third bonding material to form a third connection that electrically and mechanically connects the electrical contact member to the electrical contact on the second surface of the flip chip.

15. The method according to claim 14, wherein the electrical contact member is formed to include first and second portions, the first portion being connected to the flip chip and the second portion being connected to the substrate during the bonding step, the first portion having a lower coefficient of thermal expansion than the second portion.

16. The method according to claim 15, wherein the first portion is formed to include at least two layers of different materials, a first of the different materials having a lower coefficient of thermal expansion than a second of the different materials.

17. The method according to claim 16, wherein the first different material is chosen from the group consisting of molybdenum, tungsten and iron-nickel alloys containing 34% to 37% nickel, and the second different material is copper or an alloy thereof.

18. The method according to claim 14, wherein the first, second and third bonding materials are solder materials and the first and second bonding materials have lower reflow temperatures than the third bonding material, such that the bonding step is a reflow soldering process.

19. The method according to claim 14, further comprising the step of contacting the electrical contact member with a heatsink on a side of the electrical contact member opposite the flip chip.

* * * * *